US008725933B2

(12) United States Patent
Khan (10) Patent No.: US 8,725,933 B2
(45) Date of Patent: May 13, 2014

(54) METHOD TO DETECT UNCOMPRESSIBLE DATA IN MASS STORAGE DEVICE

(75) Inventor: Jawad B. Khan, Cornelius, OR (US)

(73) Assignee: Intel Corporation, Santa Clara, CA (US)

(*) Notice: Subject to any disclaimer, the term of this patent is extended or adjusted under 35 U.S.C. 154(b) by 303 days.

(21) Appl. No.: 13/175,534

(22) Filed: Jul. 1, 2011

(65) Prior Publication Data

US 2013/0007346 A1    Jan. 3, 2013

(51) Int. Cl.
*G06F 12/02* (2006.01)
*H03M 7/30* (2006.01)

(52) U.S. Cl.
CPC ...... *G06F 12/0246* (2013.01); *G06F 2212/401* (2013.01); *H03M 7/6082* (2013.01)
USPC ............. 711/103; 711/154; 711/E12.008

(58) Field of Classification Search
CPC .................................................. G06F 2212/401
See application file for complete search history.

(56) References Cited

U.S. PATENT DOCUMENTS

| | | | | |
|---|---|---|---|---|
| 5,991,515 | A * | 11/1999 | Fall et al. ............... | 358/1.15 |
| 7,111,142 | B2 * | 9/2006 | Spencer et al. ............ | 711/170 |
| 2003/0229761 | A1 * | 12/2003 | Basu et al. ............... | 711/134 |
| 2004/0250009 | A1 * | 12/2004 | Chen et al. ............... | 711/103 |
| 2005/0071579 | A1 * | 3/2005 | Luick ....................... | 711/154 |
| 2010/0077133 | A1 * | 3/2010 | Jeon ........................ | 711/103 |
| 2011/0099321 | A1 * | 4/2011 | Haines et al. ............ | 711/103 |
| 2011/0145486 | A1 * | 6/2011 | Owa et al. ............... | 711/103 |
| 2011/0252184 | A1 * | 10/2011 | Cho et al. ................ | 711/102 |
| 2011/0320915 | A1 * | 12/2011 | Khan ....................... | 714/773 |

OTHER PUBLICATIONS

William Culhane. "Statistical Measures as Predictors of Compression Savings." May 2008. The Ohio State University. http://kb.osu.edu/dspace/handle/1811/32015.*
Robert V. Hogg and Elliot A. Tanis. Probability and Statistical Inference. 2001. Prentice Hall. 6th ed. pp. 10-14.*
Mark Allen Weiss. Data Structures and Problem Solving Using Java. 2002. Addison Wesley. 2nd ed. pp. 683-685.*
Ruth Maran and Kelleigh Johnson. Maran Illustrated Computers Guided Tour. Jan. 2005. Course Technology PTR. pp. 40-54, 222-225.*
Chandra Krintz and Sezgin Sucu. "Adaptive On-the-Fly Compression." Nov. 2005. IEEE. IEEE Transactions on Parallel and Distributed Systems. vol. 17. pp. 15-24.*
Youngjo Park and Jin-Soo Kim. "zFTL: Power-Efficient Data Compression Support for NAND Flash-based Consumer Electronics Devices." Sep. 2011. IEEE. IEEE Transactions on Consumer Electronics. vol. 57. pp. 1148-1156.*

* cited by examiner

*Primary Examiner* — Nathan Sadler
(74) *Attorney, Agent, or Firm* — Schwabe, Williamson & Wyatt, P.C.

(57) ABSTRACT

Described are embodiments of methods, apparatus, and systems for detecting incompressible data and selectively compressing compressible data without compressing the incompressible data. A method may include determining a first compressibility value of first data of a plurality of input data and a second compressibility value of second data of the plurality of input data, determining that the first data is incompressible based at least in part on the first compressibility value relative to a compressibility threshold, and compressing the second data of the plurality of input data. Other embodiments may be described and claimed.

17 Claims, 7 Drawing Sheets

| Data Unit | Frequency |
|---|---|
| 0 | 16 |
| 1 | 16 |
| 2 | 16 |
| 3 | 16 |
| 4 | 16 |
| 5 | 16 |
| 6 | 16 |
| ⋮ | ⋮ |
| 256 | 16 |

Figure 5B

| Data Unit | Frequency |
|---|---|
| 0 | 4096 |
| 1 | 0 |
| 2 | 0 |
| 3 | 0 |
| 4 | 0 |
| 5 | 0 |
| 6 | 0 |
| ⋮ | ⋮ |
| 256 | 0 |

Figure 5C

| Data Unit | Frequency |
|---|---|
| 0 | 23 |
| 1 | 67 |
| 2 | 4 |
| 3 | 12 |
| 4 | 0 |
| 5 | 0 |
| 6 | 0 |
| ⋮ | ⋮ |
| 256 | 0 |

METHOD TO DETECT UNCOMPRESSIBLE DATA IN MASS STORAGE DEVICE

TECHNICAL FIELD

Embodiments of the present disclosure relate generally to detection of incompressible data, and more particularly, to methods, apparatuses, and systems for detecting incompressible data and selectively compressing compressible data without compressing the incompressible data.

BACKGROUND

Conventional data compression methods may allow more efficient use of storage media by using algorithms to compress an original data item having a given length measured in bits, into a compressed representation of the data item, which may include less than the original number of bits. Some data patterns, however, may not be well-suited for compression, and if compression is performed blindly on such data patterns, data expansion may occur. In these cases, the original uncompressed data must be re-fetched and written in lieu of the expanded data, which may cause loss of performance and power.

BRIEF DESCRIPTION OF THE DRAWINGS

Embodiments of the present disclosure will be described by way of example embodiments, but not limitations, illustrated in the accompanying drawings in which like references denote similar elements, and in which.

DETAILED DESCRIPTION

Illustrative embodiments of the present disclosure include, but are not limited to, methods, apparatuses, and systems for detecting incompressible data and selectively compressing compressible data without compressing the incompressible data.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present disclosure. This application is intended to cover any adaptations or variations of the embodiments discussed herein. Therefore, it is manifestly intended that the embodiments of the present disclosure be limited only by the claims and the equivalents thereof.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
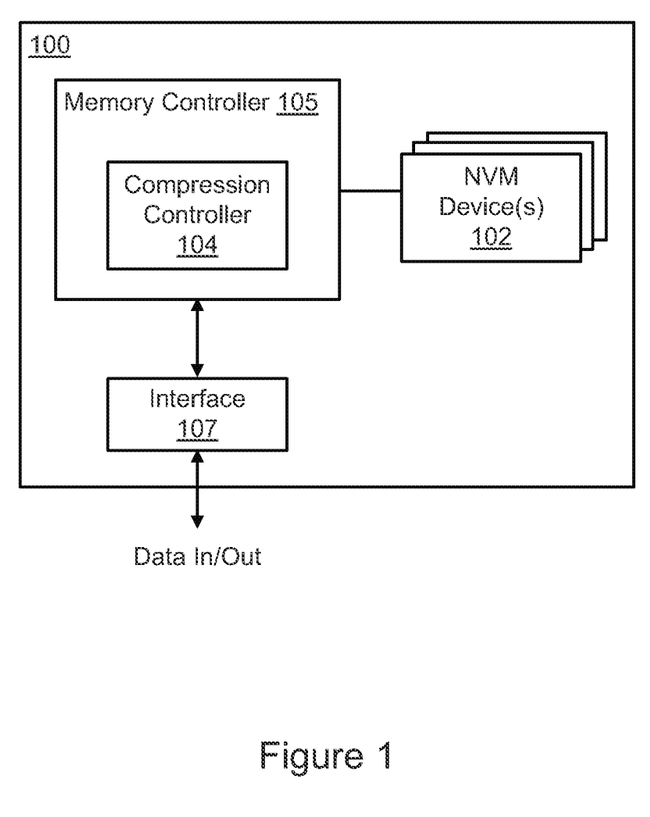
FIG. 1 schematically illustrates an example apparatus configured to detect incompressible data and selectively compress compressible data without compressing the incompressible data, in accordance with various embodiments of the present disclosure.

FIG. 1 schematically illustrates an example apparatus 100, in accordance with various embodiments of the present disclosure. The apparatus 100 may include non-volatile memory (NVM) device(s) 102 and a compression controller 104. The compression controller 104 may be configured to detect incompressible input data and selectively compress compressible input data without compressing the incompressible data. In various embodiments, the compression controller 104 may be located in a memory controller 105 of the apparatus 100, as illustrated in FIG. 1, or may instead be located apart from the memory controller 105, as illustrated for the apparatus 200 in FIG. 2. The memory controller 105 may be configured to provide an interface to the NVM devices 102.

The NVM devices 102 may include an array of non-volatile memory devices (e.g., chips) comprising non-volatile memory cells. The NVM devices 102 may include, for example, NAND flash memory, NOR flash memory, or phase-change memory. The NVM devices 102 may comprise single-level or multi-level memory cells, or a combination thereof. For embodiments in which the NVM devices 102 comprise phase-change memory, the phase-change memory cells may comprise vertically integrated memory cells in which a phase-change memory element is layered with an Ovonic Threshold Switch (OTS) in a cross-point array, a Phase Change Memory with Switch (PCMS) device (not illustrated). Though not illustrated, the NVM devices 102 may be arranged in accordance with conventional memory devices by including, for example, a plurality of addressable memory banks, each including a plurality of memory cells arranged in rows and columns, forming wordlines and bitlines, respectively. The memory banks may contain addressable blocks (or sectors) of memory cells.

The apparatus 100 may be a solid-state drive (SSD), which may be configured to be coupled with a host device, including, but not limited to, various computing and/or consumer electronic devices/appliances, such as desktop, laptop, or tablet computers. To that end, the interface 107 may comprise any suitable interface for coupling the apparatus 100 to a host device, such as, for example, but not limited to, a serial advanced technology attachment (SATA) interface, a serial attached SCSI (SAS) interface, a universal serial bus (USB), interface, a peripheral control interface (PCI), or other suitable device interface.

Figure 2:
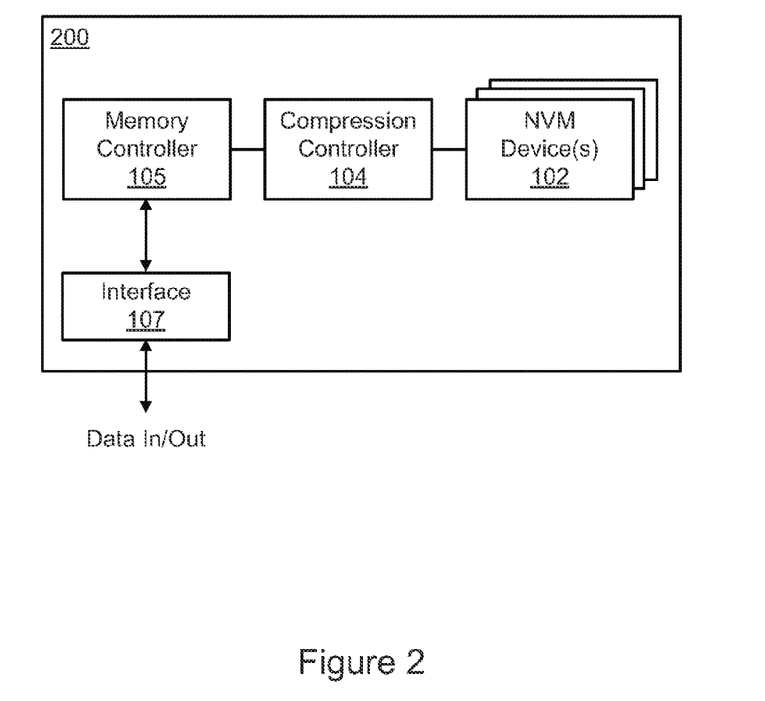
FIG. 2 schematically illustrates another example apparatus configured to detect incompressible data and selectively compress compressible data without compressing the incompressible data, in accordance with various embodiments of the present disclosure.
Figure 3:
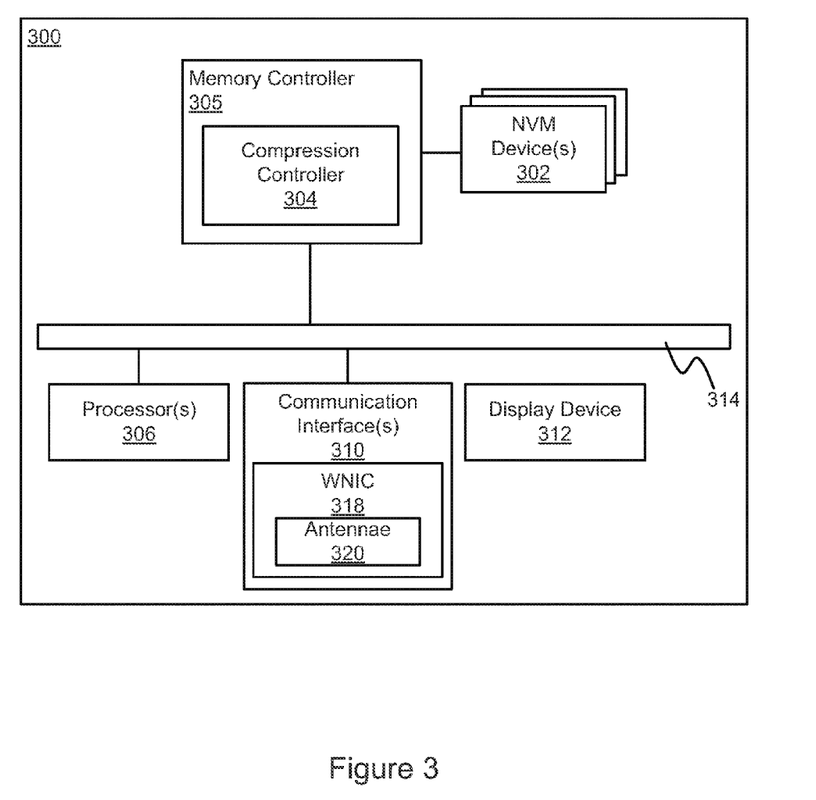
FIG. 3 schematically illustrates an example system including a compression controller configured to detect incompressible data and selectively compress compressible data without compressing the incompressible data, in accordance with various embodiments of the present disclosure.

The apparatus 100 may be a stand-alone device or may be incorporated into various systems including, but not limited to, various computing and/or consumer electronic devices/appliances, such as desktop computing device, a mobile computing device (e.g., a laptop computing device, a handheld computing device, a tablet, a netbook, etc.), mobile phones, smart phones, personal digital assistants, servers, workstations, set-top boxes, digital reorders, game consoles, digital media players, and digital cameras. A block diagram of an example system 300 is illustrated in FIG. 3. The system 300 may comprise one or more processor(s) 306, a memory controller 305 including a compression controller 304, and NVM devices 302 coupled to the memory controller 305. The compression controller 304 may be configured to detect incompressible data and selectively compress compressible data without compressing the incompressible data. In various embodiments, the compression controller 304 may be apart from the memory controller 305 (as illustrated in FIG. 2). In various embodiments, the system 300 may have more or fewer components, and/or different architectures.

The NVM devices 302 may be similar to the NVM devices 102 described herein. The NVM devices 302 may include, for example, NAND flash memory, NOR flash memory, or phase-change memory, and may comprise single-level or multi-level memory cells, or a combination thereof. The NVM devices 302 may include a storage resource physically part of a device on which the system 300 is installed or it may be accessible by, but not necessarily a part of, the device. In various embodiments, the compression controller 304, either on or apart from the memory controller 305, may also be physically part of a device on which the system 300 is installed or it may be accessible by, but not necessarily a part of, the device.

The system 300 may comprise a communication mechanism or bus 314 for communicating information. A host bus adapter (not illustrated) or other suitable adaptor may operatively couple the memory controller 304 and the bus 314 via a suitable interface including, for example, a peripheral control interface (PCI), or other suitable device interface. Likewise, the memory controller 305 may couple via a suitable interface including, for example, a serial advanced technology attachment (SATA) interface, a serial attached SCSI (SAS) interface, a universal serial bus (USB), interface, a peripheral control interface (PCI), or other suitable device interface. In various embodiments, the processor 306 may be directly coupled to the memory controller 305 (i.e., without a host bus adapter). For example, in various embodiments in which the compression controller 304 is implemented in a smart phone, etc., a host bus adapter may not be necessary.

The system 300 may include communications interface(s) 310 to provide an interface for system 300 to communicate over one or more networks and/or with any other suitable device. The communications interface(s) 310 may include any suitable hardware and/or firmware. The communications interface(s) 310 for one embodiment may include, for example, a network adapter, a wireless network adapter, a telephone modem, and/or a wireless modem. For wireless communications, the communications interface(s) 310 for one embodiment may include a wireless network interface controller 318 having one or more antennae 320 to establish and maintain a wireless communication link with one or more components of a wireless network. The system 300 may wirelessly communicate with the one or more components of the wireless network in accordance with any of one or more wireless network standards and/or protocols.

The system 300 may include a display device 312, such as, for example, a cathode ray tube (CRT), liquid crystal display (LCD), light emitting diode (LED), or other suitable display device, coupled to the bus 314 for displaying information.

Figure 4:
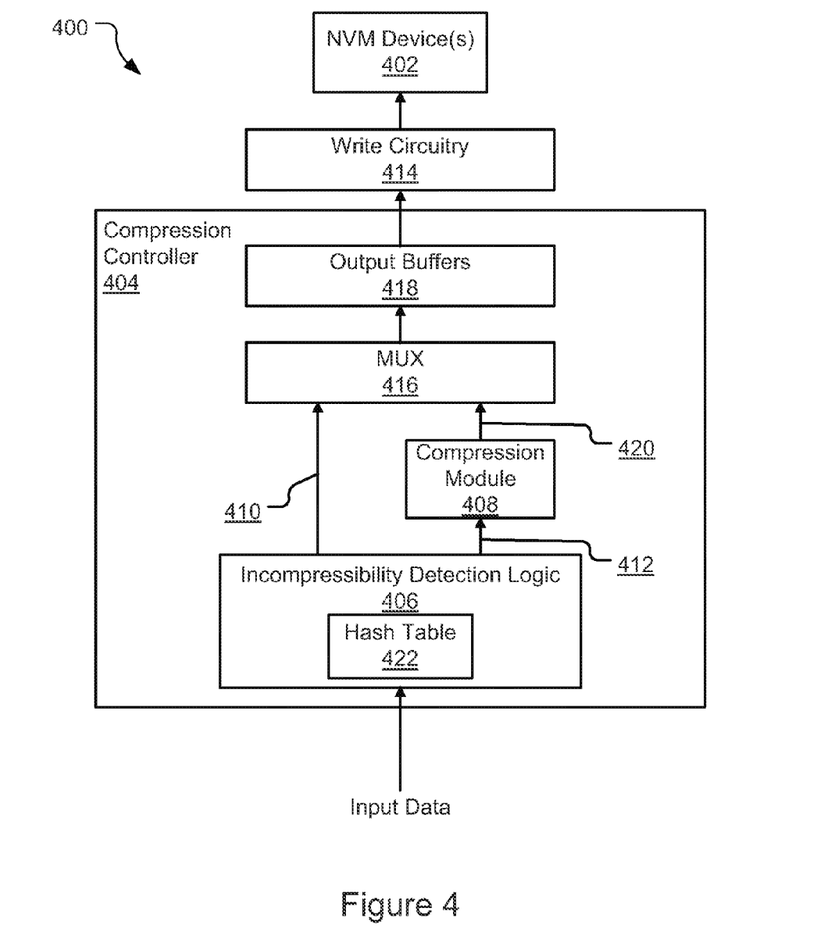
FIG. 4 schematically illustrates an example system including a compression controller configured to detect incompressible data and selectively compress compressible data without compressing the incompressible data, in accordance with various embodiments of the present disclosure.

FIG. 4 schematically illustrates an example system 400 including a more detailed viewed of an example compression controller 404 configured to detect incompressible data and selectively compress compressible data without compressing the incompressible data, in accordance with various embodiments of the present disclosure. The system 400 may include the compression controller 404, write circuitry 414, and NVM devices 402. The compression controller 404 may include an incompressibility detection module 406 and a compression module 408.

In general, various embodiments may be based on the fact that there may be a high correlation between data entropy and data incompressibility. Highly entropic data may be incompressible, and random data sets typically expand on compression. By identifying incompressible data, blind compression by the compression module 408 can be bypassed altogether, which may result in bandwidth and power savings. As noted elsewhere herein, blindly performing compression on all input data may result in wasted power as not all data patterns are well-suited for compression, and attempting compression on such input data may result in data expansion. When data expansion occurs, the original uncompressed data must be fetched and written, leading to performance losses (e.g., loss of bandwidth) and power losses. In some instances, for example, avoiding compressing incompressible data may reduce system power significantly because a compression engine can easily be around 2 to 4 million gates of logic in size. Idling that many gates in an SSD controller could result in significant power savings.

The incompressibility detection module 406 of the compression controller 404 may be configured to determine whether the input data, or some portion of the input data, is incompressible, rather than determining whether the input data is compressible, which can be a complicated endeavor. If input data is determined to be incompressible, the input data may bypass the compression module 408 via path 410 to write circuitry 414. To that end, the incompressibility detection module 406 generally may be located anywhere in the data path as long as the incompressibility detection module 106 precedes the compression module 108.

The other input data (i.e., data not determined to be incompressible) may be provided to the compression module 408 to be compressed via path 412. After the input data is compressed, the compressed input data may be provided, via path 420, to the write circuitry 414.

In various embodiments, a multiplexer 416 may receive the incompressible data from the incompressibility detection module 406 and the compressed data from the compression module 408, and provide the incompressible data to the write circuitry 414 via output buffers 418. The write circuitry 414 may be configured to write the incompressible data and the compressed data to the memory block 402.

To determine whether input data is incompressible, the incompressibility detection module 106 may be configured to determine a compressibility value of the input data and determine whether data is incompressible based at least in part on the compressibility value compared to a compressibility threshold. The compressibility value of the input data may be determined, at least in part, by tracking the frequency of instances of any given data unit (i.e., a symbol) in a data block. When a particular data unit is encountered in the data block, the frequency value may be incremented for that data unit, and when the entire data block has been searched, the average frequency of all of the data units may be calculated. In various embodiments, only the non-zero frequency values are used for calculating the average frequencies.

Figure 5A:
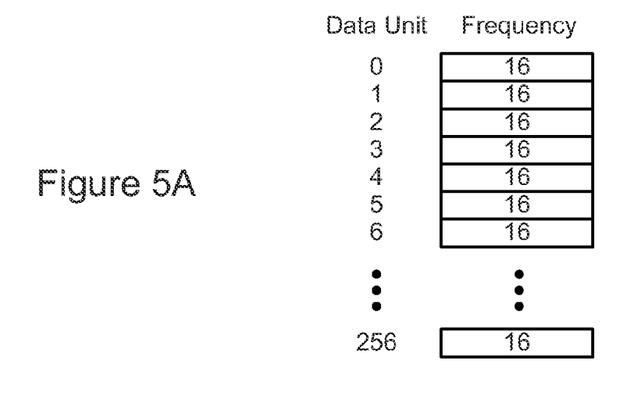
FIGS. 5A, 5B, and 5C illustrate example hash tables associated with an operation of the memory apparatus of FIG. 4, in accordance with various embodiments of the present disclosure.
Figure 5B:
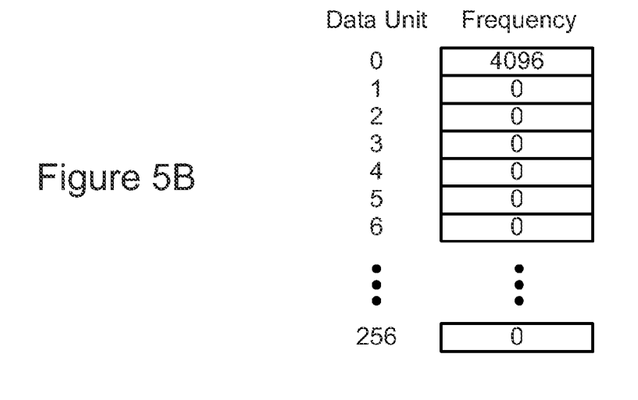
Figure 5C:
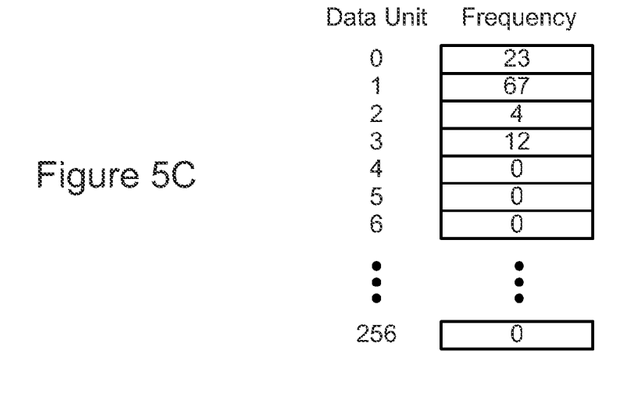

The frequencies of the data units may be tracked in a hash table 422 maintained in hardware. FIGS. 5A, 5B, and 5C illustrate example hash tables associated with an operation of the compression controllers described herein, in accordance with various embodiments of the present disclosure. For the examples illustrated, 8-bit data units are used. For 8-bit data units, there are 256 possible combinations. Prior to tracking the frequencies, all 256 locations of the hash table may be cleared out.

For the example hash table illustrated in FIG. 5A, each of the 256 data units are located in the data block 16 times. For this example, the average frequency of all of the data units is 16 (i.e., (16*16) occurrences/256 data units=16). The compressibility value of the input data, therefore, may be assigned a 16. It should be noted that for ease of hardware implementation, or otherwise, the compressibility value may be normalized. For the embodiment illustrated in FIG. 5A, for example, the compressibility value could be normalized by dividing it by 16, to arrive at a compressibility value of 1.

For the example hash table illustrated in FIG. 5B, the data block is completely filled with the data unit 0 for a total of 4096 times. For this example, the zero frequency values may be ignored, and only the non-zero frequency values may be used for calculating the average frequencies. The average frequency of all of the data units, therefore, is 4096 (i.e., 4096 occurrences/1 data unit=4096). The compressibility value of the input data, therefore, may be assigned a 4096, or some other normalized value.

Yet another example hash table is illustrated in FIG. 5C. As illustrated, the data block is filled with the four different data units (data units 0, 1, 2, and 4). For this example, the zero frequency values may be ignored, and only the non-zero frequency values may be used for calculating the average frequencies. The average frequency of all of the data units, therefore, is 26.5 (i.e., (23+67+4+12) occurrences/4 data units=26.5). The compressibility value of the input data, therefore, may be assigned a 26.5, or some other normalized value.

In general, highly-compressible data blocks may be indicated by higher compressibility values. For the embodiments illustrated in FIGS. 5A, 5B, and 5C, therefore, the input data represented in the hash table of FIG. 5B is the most compressible, while the input data represented in the hash table of FIG. 5A is the least compressible. To determine whether data is incompressible, some arbitrary compressible threshold may be set in the incompressibility detection module 406, such that compressibility values lower than the compressible threshold may be deemed incompressible by the incompressibility detection module 406.

In various embodiments, incompressibility detection module 406 may be configured to search the multiple data units and update the hash table 422 in parallel.

In addition, while the illustrated hash table examples use 8-bit data units, with 16×256 (4 KB) data blocks, the data units and data blocks may be of any size, and the data blocks may be treated independently from each other. For SSDs, logical to physical mapping tables (also known as indirection tables) may be employed. Each indirection system may have a minimum tracking granularity (usually a sector but may be more) with which the input data from a host device may be tracked inside the SSD. Due to indirection tracking complexities it may be important to define an indirection tracking granularity (such as nearest sector or 1 KB, etc.). A compressed data block may be padded to the nearest indirection granularity boundary for ease of tracking in the indirection system.

The management of compressed versus uncompressed data blocks may be performed by firmware of the compression controller 404. In general, the firmware may be agnostic of whether a data block is compressed or not. In various embodiments, if a data block is determined to be free (i.e., the host device has not yet written to that part of the NVM devices 402), the data block may be used for swap space. In case of compression, the data block's reported size to the host device will not change, and if the data is compressible, extra spare area may be created (more permanently-free blocks) which may be used by the firmware for improving the write performance of the system 400.

Detection of incompressible data and selective compression of compressible data without compressing the incompressible data may be particularly useful for those computers having a large number of compressed images (JPEG), MP3s, and videos, which constitute a vast majority of the consumer personal computers. These file types are already compressed and almost always expand upon further compression. In various embodiments, therefore, one or more of these file types may automatically bypass the compression module 108, which may save power. In various embodiments, it has been determined that by just compressing the operating system, a significant amount of extra spare area of the NVM devices 402 may be obtained.

Figure 6:
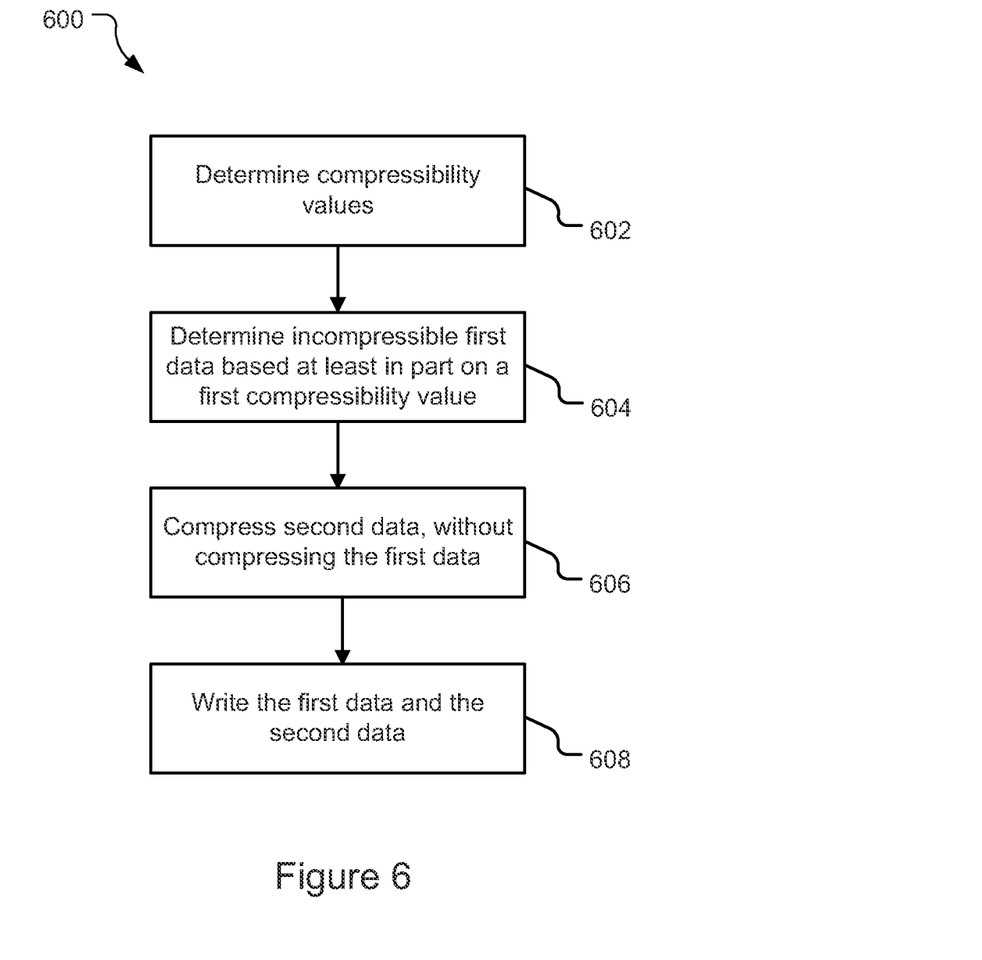
FIG. 6 illustrates an example method for operating a memory apparatus configured to detect incompressible data and selectively compress compressible data without compressing the incompressible data, in accordance with various embodiments of the present disclosure.
Figure 7:
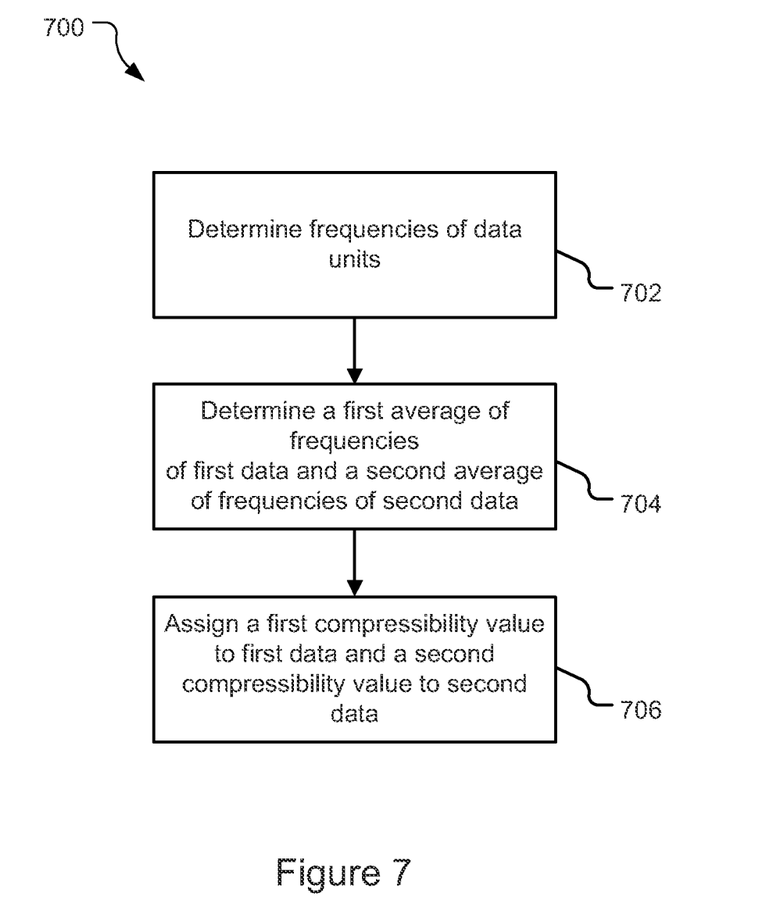
FIG. 7 illustrates an example method for operating a memory apparatus configured to detect incompressible data and selectively compress compressible data without compressing the incompressible data, in accordance with various embodiments of the present disclosure.

FIG. 6 and FIG. 7 illustrate example methods 600, 700 for operating an apparatus or system (such as apparatus 100, apparatus 200, or system 300, for example) configured to detect incompressible data and selectively compress compressible data without compressing the incompressible data, in accordance with various embodiments of the present disclosure. It should be noted that although the methods 600, 700 are each illustrated as a series of sequential steps, the methods are not necessarily order dependent. Moreover, methods within the scope of this disclosure may include more or fewer steps than those illustrated in FIG. 6 and FIG. 7.

Turning now to FIG. 6, the method 600 may include one or more functions, operations, or actions as is illustrated by block 602, 604, 606, and/or block 608. Processing for the method 600 may start with block 602 by determining a first compressibility value of first data of a plurality of input data and a second compressibility value of second data of the plurality of input data.

The method 600 may proceed to block 604 by determining that the first data is incompressible based at least in part on the first compressibility value relative to a compressibility threshold. In various embodiments, the first compressibility value of the first data may be compared to the compressibility threshold, and as discussed herein, in various embodiments, the first data may be determined to be incompressible if a compressibility value is lower than, or equal to, a predetermined compressible threshold.

The method 600 may proceed to block 606 by compressing the second data of the plurality of input data. In these embodiments, the incompressible first data may bypass the compression operation.

The method 600 may proceed to block 608 by writing the uncompressed first data and the compressed second data to a memory block. In various embodiments, the memory block may be a solid-state memory block comprising NAND flash memory or other suitable non-volatile memory.

FIG. 7 illustrates further details of the operation depicted at block 602 of FIG. 6 (i.e., determining a first compressibility value of first data of a plurality of input data and a second compressibility value of second data of the plurality of input data). The method 700 may include one or more functions, operations, or actions as is illustrated by block 702, 704, and/or block 706. Processing for the method 700 may start with block 702 by determining frequencies of data units among the plurality of input data. When a particular data unit is encountered in a data block, the frequency value may be incremented for that data unit, and when the entire data block has been searched, the average frequency of all of the data units may be calculated. In various embodiments, only the non-zero frequency values are used for calculating the average frequencies. The frequencies of the data units may be tracked in a hash table.

The method 700 may proceed to block 704 by determining a first average of frequencies of the data units among the first data of the plurality of input data, and determining a second average of frequencies of the data units among the second data of the plurality of input data. In various embodiments, the averages may be normalized.

The method 700 may proceed to block 706 by assigning the first compressibility value to the first data based at least in part on the first average, and assigning the second compressibility value to the second data based at least in part on the second average. As discussed herein, in general, highly-compressible data blocks may be indicated by higher compressibility values. Processing may then continue to block 704, 706, and/or 708 of FIG. 6.

Although certain example methods, apparatus, and articles of manufacture have been described herein, the scope of coverage of the present disclosure is not limited thereto. On the contrary, the present disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A method comprising:
   determining, by a computing device, a first compressibility value of first data of a plurality of input data and a second compressibility value of second data of the plurality of input data;
   determining, by the computing device, that the first data is incompressible based at least in part on the first compressibility value relative to a compressibility threshold; and
   compressing, by the computing device, the second data of the plurality of input data,
   wherein the determining the first compressibility value comprises determining a first arithmetic average of non-zero frequencies of data units among the first data of the plurality of input data, and determining the second compressibility value comprises determining a second arithmetic average of non-zero frequencies of data units among the second data of the plurality of input data.

2. The method of claim 1, further comprising, after compressing the second data, writing the first data and the second data to a solid-state memory device.

3. The method of claim 2, wherein the solid-state memory device comprises NAND flash memory or phase-change memory.

4. The method of claim 2, wherein the writing the first data comprises, after compressing the second data, writing the first data to the solid-state memory device without compressing the first data.

5. The method of claim 1, wherein the determining that the first data is incompressible comprises comparing the first compressibility value of the first data to the compressibility threshold.

6. The method of claim 1, wherein the determining the first compressibility value and the second compressibility value further comprises:
   assigning the first compressibility value to the first data based at least in part on the first average; and
   assigning the second compressibility value to the second data based at least in part on the second average.

7. An apparatus comprising:
   an incompressibility detection module configured to determine a first compressibility value of first data of a plurality of input data and a second compressibility value of second data of the plurality of input data, and determine that the first data is incompressible based at least in part on the first compressibility value relative to a compressibility threshold; and
   a compression module operatively coupled to the incompressibility detection module and configured to compress the second data of the plurality of input data,
   wherein the incompressibility detection module is configured to determine the first compressibility value based at least in part on a first arithmetic average of non-zero frequencies of data units among the first data of the plurality of input data, and the second compressibility value based at least in part on a second arithmetic average of non-zero frequencies of data units among the second data of the plurality of input data.

8. The apparatus of claim 7, further comprising write circuitry configured to write the first data and the compressed second data to a solid-state memory device.

9. The apparatus of claim 8, wherein the compression module is configured to provide the first data to the write circuitry without compressing the first data.

10. The apparatus of claim 7, further comprising a solid-state memory device comprising NAND flash memory or phase-change memory.

11. The apparatus of claim 10, further comprising a memory controller, wherein the incompressibility detection module is operatively coupled between the memory controller and the solid-state memory device.

12. The apparatus of claim 7, wherein the incompressibility detection module is configured to determine that the first data is incompressible by comparing the first compressibility value of the first data to the compressibility threshold.

13. The apparatus of claim 7, further comprising a hash table, wherein the incompressibility detection module is configured to track instances of the data units among the first or second data in the hash table.

14. A system comprising:
   a memory apparatus including:
      an incompressibility detection module configured to determine a first compressibility value of first data of a plurality of input data and a second compressibility value of second data of the plurality of input data, and determine that the first data is incompressible based at least in part on the first compressibility value relative to a compressibility threshold, wherein the incompressibility detection module is configured to determine the first compressibility value based at least in part on a first arithmetic average of non-zero frequencies of data units among the first data of the plurality of input data, and the second compressibility value based at least in part on a second arithmetic average of non-zero frequencies of data units among the second data of the plurality of input data; and
      a compression module operatively coupled to the incompressibility detection module and configured to compress the second data of the plurality of input data;
   a bus operatively coupled to the memory apparatus; and
   a display device operatively coupled to the bus.

15. The system of claim 14, further comprising a memory controller, wherein the memory controller includes the incompressibility detection module and the compression module.

16. The system of claim 14, wherein the system is a selected one of a desktop computer, a laptop computer, a handheld computer, a tablet computer, a netbook computer, a server, a set-top box, a digital recorder, a game console, a smart phone, a personal digital assistant, a mobile phone, a digital media player, or a digital camera.

17. The system of claim 14, further comprising one or more antennae and configured to establish a wireless communication link with one or more components of a wireless network.

* * * * *